United States Patent
Bowman et al.

(10) Patent No.: US 9,250,308 B2
(45) Date of Patent: Feb. 2, 2016

(54) SIMPLIFIED ENERGY METER CONFIGURATION

(75) Inventors: Marc Bowman, Porland, OR (US);
Aaron Parker, Happy Valley, OR (US)

(73) Assignee: Veris Industries, LLC, Tualatin, OR (US)

( * ) Notice: Subject to any disclaimer, the term of this patent is extended or adjusted under 35 U.S.C. 154(b) by 797 days.

(21) Appl. No.: 13/466,605

(22) Filed: May 8, 2012

(65) Prior Publication Data

US 2012/0310557 A1  Dec. 6, 2012

Related U.S. Application Data

(60) Provisional application No. 61/492,964, filed on Jun. 3, 2011.

(51) Int. Cl.
*G01R 21/133* (2006.01)
*G01R 35/04* (2006.01)

(52) U.S. Cl.
CPC ............. *G01R 35/04* (2013.01); *G01R 21/133* (2013.01)

(58) Field of Classification Search
CPC .................................................... G01R 21/133
USPC ........................................................... 702/61
See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa, Jr. |
| 2,411,405 A | 11/1946 | Yuhas |
| 2,412,782 A | 12/1946 | Palmer |
| 2,428,613 A | 10/1947 | Boyajian |
| 2,428,784 A | 10/1947 | Cole |
| 2,512,070 A | 6/1950 | Nelson et al. |
| 2,663,190 A | 12/1953 | Ilgenfritz |
| 2,746,295 A | 5/1956 | Lubkin |
| 2,776,406 A * | 1/1957 | Cohn ...................... G01R 21/00 324/103 R |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |

(Continued)

FOREIGN PATENT DOCUMENTS

| | | |
|---|---|---|
| EP | 1531334 A2 | 5/2005 |
| JP | 5083776 | 4/1993 |

OTHER PUBLICATIONS

AT91M42800A Summary, "AT91 ARM Thumb Microcontrollers," Atmel, Feb. 2002.

(Continued)

*Primary Examiner* — Bryan Bui
(74) *Attorney, Agent, or Firm* — Chernoff Vilhauer McClung & Stenzel, LLP

(57) ABSTRACT

A method of configuring a power meter may include comparing a maximum power measurable by the power meter to a pulse output power comprising a pulse having an initial pulse weight and an initial pulse duration. The power meter may change at least one of the pulse weight and the pulse duration until the pulse output power is at least equal to the maximum power measurable by the power meter.

17 Claims, 6 Drawing Sheets

(56) References Cited

U.S. PATENT DOCUMENTS

| | | |
|---|---|---|
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Sanger et al. |
| 3,584,294 A | 6/1971 | Siwko |
| 3,593,078 A | 7/1971 | Dornshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 3,976,924 A | 8/1976 | Vanjani |
| 4,001,647 A | 1/1977 | Klein et al. |
| 4,001,758 A | 1/1977 | Esper et al. |
| 4,007,401 A | 2/1977 | Kimmel et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,124,030 A | 11/1978 | Roberts |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,182,983 A * | 1/1980 | Heinrich et al. ............. 324/142 |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Mikovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,885,655 A | 12/1989 | Springer et al. |
| 4,887,018 A | 12/1989 | Libert |
| 4,890,318 A | 12/1989 | Crane et al. |
| 4,926,105 A | 5/1990 | Mischenko et al. |
| 4,926,131 A * | 5/1990 | Leydier ......................... 327/126 |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,991,050 A | 2/1991 | Heberlein, Jr. et al. |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,249,231 A | 9/1993 | Covey et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,359,273 A | 10/1994 | Fluckiger |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,502,374 A | 3/1996 | Cota |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |

(56) References Cited

U.S. PATENT DOCUMENTS

| | | |
|---|---|---|
| 5,995,911 A | 11/1999 | Hart |
| 6,005,760 A | 12/1999 | Holce et al. |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,219,216 B1 | 4/2001 | Holce et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,724,600 B2 | 4/2004 | Holce et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,174,261 B2 | 2/2007 | Gunn et al. |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,313,668 B2 | 12/2007 | Worley |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,362,232 B2 | 4/2008 | Holle et al. |
| 7,447,603 B2 | 11/2008 | Bruno |
| 7,474,088 B2 | 1/2009 | Bowman et al. |
| 8,212,548 B2 | 7/2012 | Parker et al. |
| 2004/0183522 A1 | 9/2004 | Gunn et al. |
| 2004/0227503 A1 | 11/2004 | Bowman et al. |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed et al. |
| 2009/0049222 A1 | 2/2009 | Lee et al. |
| 2009/0115400 A1 | 5/2009 | Hunter |
| 2009/0115620 A1 | 5/2009 | Hunter |
| 2011/0156698 A1 | 6/2011 | Cook |

OTHER PUBLICATIONS

Description of KT® 6300, 6400 Split-Core kW/kWH Transducers . . . Enercept KT®, 1 page by Hawkeye® (by Veris Industries, Inc.), at least one year prior to filing (1997) (unavailable month).

Ganssie, "Interrupt Latency," Embedded.com, Article.. jhmtl?articleID=9900320, Aug. 26, 2004 <www.embedded.com/show>.

* cited by examiner

SIMPLIFIED ENERGY METER CONFIGURATION

CROSS-REFERENCE TO RELATED APPLICATIONS

This application claims the benefit of U.S. Provisional App. No. 61/492,964, filed Jun. 3, 2011.

BACKGROUND OF THE INVENTION

The present invention relates to power and energy meters and, more particularly, to a simplified method of configuring a digital power or energy meter.

The total power consumption of a building or other facility is monitored by the electric utility with a power meter located between the utility's distribution transformer and the facility's power distribution panel. However, in many instances it is desirable to sub-meter or attribute the facility's power or energy usage and cost to different occupancies, buildings, departments, or cost centers within the facility or to monitor the power consumption of individual loads or groups of loads, such as motors, lighting, heating units, cooling units, etc. These single phase or multi-phase electrical loads are typically connected to one or more of the branch circuits that extend from the facility's power distribution panel.

Flexibility has favored adoption of digital power and energy meters incorporating data processing systems that can monitor one or more circuits and determine a number of parameters related to electricity consumption. A digital power or energy meter for measuring electricity consumption typically comprises one or more voltage and current transducers that are periodically read by the meter's data processing unit which, in a typical digital meter, comprises one or more microprocessors or digital signal processors (DSP). The data processing unit periodically reads and stores the outputs of the transducers quantifying the magnitudes of current and voltage samples and, using that data, calculates the current, voltage, power, and other electrical parameters, such as active power, apparent power and reactive power that quantify electricity distribution and consumption. The calculated parameters are typically output to a display for immediate viewing or transmitted from the meter's communications interface to another data processing system, such as a building management computer for remote display or further processing, for example formulating instructions to automated building equipment.

The voltage transducers of digital power and energy meters commonly comprise a voltage divider network that is connected to a conductor in which the voltage will be measured. The power distribution panel provides a convenient location for connecting the voltage transducers because typically each phase of the power is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be interconnected anywhere in the wiring that connects the supply and a load, including at the load's terminals.

The current transducers of digital power and energy meters typically comprise current transformers that encircle the respective power cables that connect the monitored circuit to the bus bar(s) of the distribution panel. A current transformer typically comprises multiple turns of wire wrapped around the cross-section of a toroidal core. The power cable conducting the load current is passed through the aperture in the center of the toroidal core and constitutes the primary winding of the transformer and the wire wrapped around the cross-section of the core comprises the transformer's secondary winding. Current flowing in the primary winding (primary current) induces a secondary voltage and current in the secondary winding which is quantitatively related to the current in the primary winding. The secondary winding is typically connected to a resistor network and the magnitude of the primary current is determined from the amplitude of the voltage at the output of the resistor network. To measure the power consumed by a load, a current transformer must be installed encircling each conductor in which the current will be measured.

While flexibility has made digital power and energy meters attractive, the ability to monitor a plurality of circuit arrangements conducting widely varying levels of energy complicates meter configuration increasing the time required for meter commissioning and the possibility of errors. What is desired, therefore, is a simplified method for configuring a power and energy meter.

DETAILED DESCRIPTION OF PREFERRED EMBODIMENTS

Figure 1:
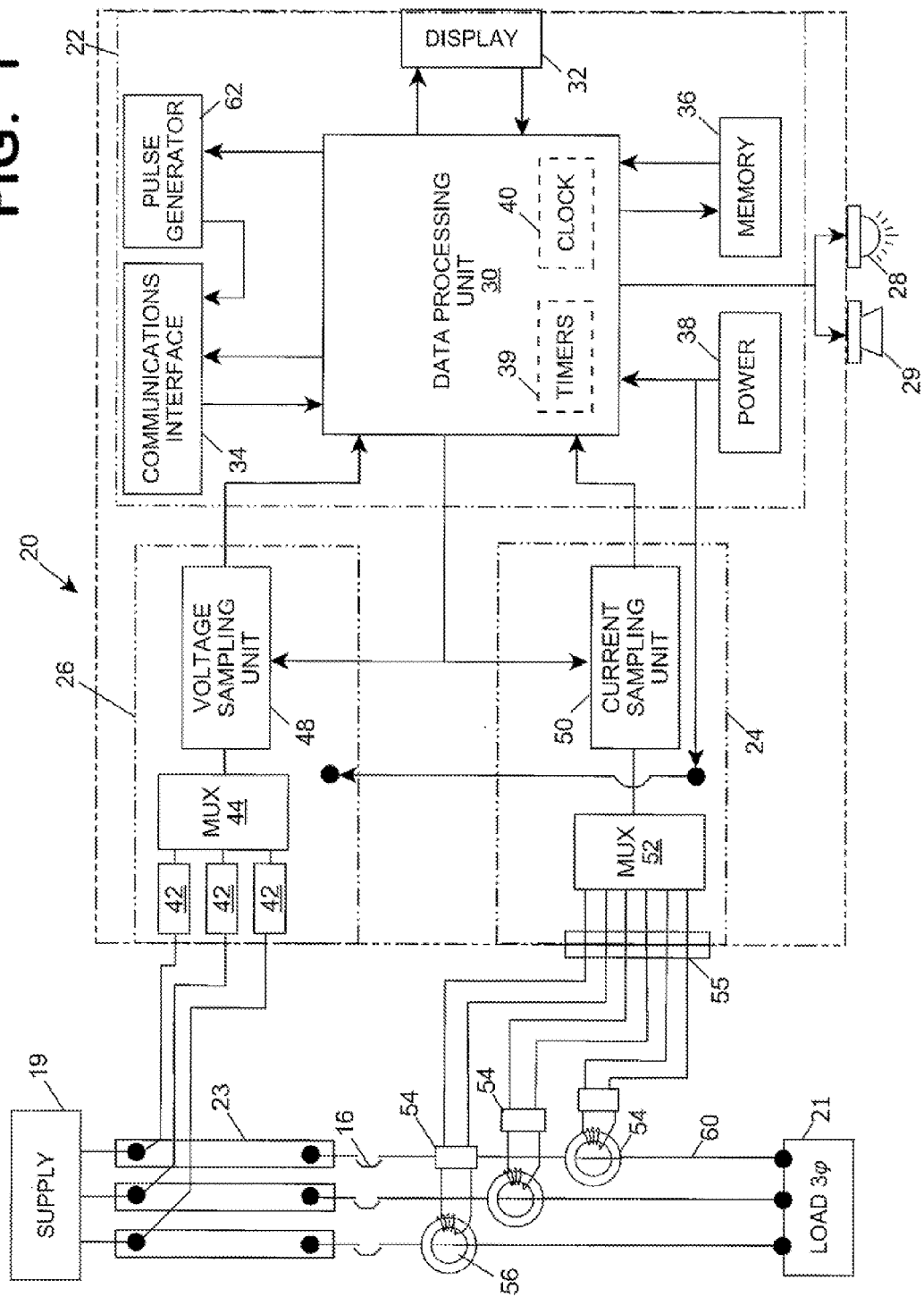
FIG. 1 is a schematic diagram of a digital power and energy meter.

Referring in detail to the drawings where similar parts are identified by like reference numerals, and, more particularly to FIG. 1, a digital power and energy meter 20 arranged to monitor the voltage and current in a circuit comprises, generally, a data processing module 22, a current sensing section 24 and a voltage sensing section 26. The data processing module 22 comprises a data processing unit 30 which, typically, comprises at least one microprocessor or digital signal processor (DSP). The data processing module may also include a memory 36 in which the software for the data processing unit and the data manipulated by the data processing unit may be stored. In addition, the data processing module may include a power supply 38 to provide power to the data processing unit and to the voltage and current sensing sections and one or more timers 39 to measure intervals between the occurrences of events. The data processing unit 30 reads and stores data received periodically from the voltage sensing section and the current sensing section, and uses that data to calculate the current, voltage, power and other electrical parameters that are the meter's output. The calculated values may be output to a display 32 for viewing at the meter and/or output to a communications interface 34 for transmission to another data processing system, such as a building management computer, for remote display or use in automating or managing facility functions. The MODBUS® RTU communication protocol and the BACnet® data communication protocol are commonly used in communicating the output of a digital power and energy meter to other elements of a data processing network, such as a facility management computer system. The meter may also include audible 29 and visual 28 alarms to alert users that the monitored circuit is operating abnormally. During meter set up, user input to the data processing unit 30 is commonly through a touch screen display 32 or a remote computer connected to the communications interface 34.

The voltage sensing section 26 includes one or more voltage transducers 42 each typically comprising a resistor network, a voltage sampling unit 48 to sample the output of the voltage transducers and convert the analog measurements to digital data suitable for use by the data processing unit 30, and a multiplexer 44 that periodically connects the voltage sampling unit to selected ones of the voltage transducers enabling periodic sampling of the magnitude of the voltage.

Figure 2A:
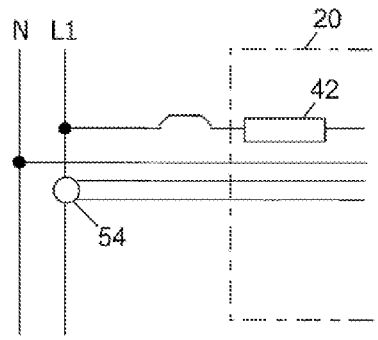
FIG. 2A is a schematic diagram of voltage and current transducer connections for single-phase, line-to-neutral circuit monitoring.
Figure 2B:
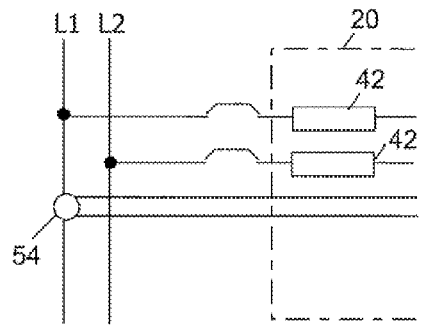
FIG. 2B is a schematic diagram of voltage and current transducer connections for single-phase, line-to-line circuit monitoring.
Figure 2C:
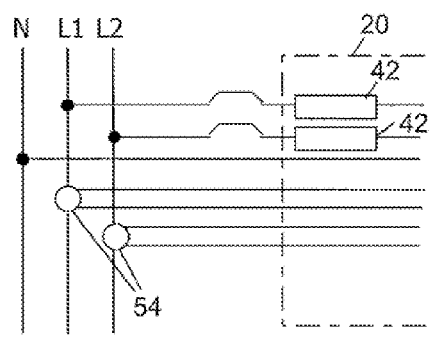
FIG. 2C is a schematic diagram of voltage and current transducer connections for single-phase, direct voltage circuit monitoring.
Figure 2D:
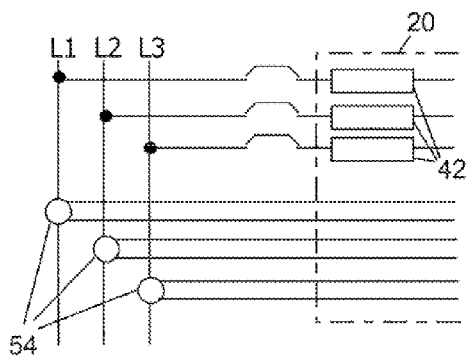
FIG. 2D is a schematic diagram of voltage and current transducer connections for three-phase, three wire circuit monitoring.
Figure 2E:
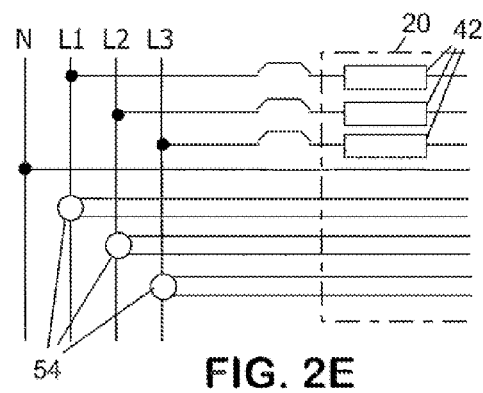
FIG. 2E is a schematic diagram of voltage and current transducer connections for three-phase, four wire Wye circuit monitoring.

A digital power and energy meter can be configured to measure voltage in a plurality of circuit types conducting either alternating current (AC) or direct current (DC). Typically, each phase of AC electricity supplied to a distribution panel is connected to a bus bar 23 to which are connected circuit breakers 16 providing a conductive interconnection of the supply 19 and each of the loads, for example, load 21, served by the panel. For example, referring FIGS. 2A-2D, typical circuit types include a single-phase, line-to-neutral circuit having a connection to a single voltage transducer 42 (FIG. 2A) and a single-phase, line-to-line, two wire system or a single-phase, direct voltage connection with connections to two voltage transducers 42 (FIGS. 2B and 2C). Three-phase circuits (FIGS. 2D and 2E) include three voltage transducers 42 for measuring the voltage in each of the three conductors conducting a single phase of the electricity. In addition to the flexibility of monitoring voltage in a plurality of circuit types, digital power and energy meters may be configurable to monitor circuits with a wide range of voltages. DC power and energy meters utilize a single voltage transducer. For example, a power and energy meter from Veris Industries, L.L.C. can monitor circuits with nominal voltages from 90 volts (V) to 600V.

The current sensing section 24 typically comprises a current sampling unit 50, a multiplexer 52 and one or more current transducers 54 communicatively connected to respective sensor positions 55 of the current sensing section. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer to a digital signal for acquisition and processing by the data processing unit. A clock 40, which may be included in the data processing unit, provides a periodic timing signal to the data processing unit which outputs a sampling signal to trigger sampling of the transducer output by the voltage and current sampling sections.

Current sensing is performed by one or more current transducers that are connected to the current sensing section. Current transducers may include resistor networks, usually in combination with a shunt resistor in series with the load. In AC power and energy meters, the current transducers 54 are commonly current transformers although other types of sensors may be used. Each current transformer comprises a coil of wire wound on the cross-section of a toroidal metallic or non-metallic core. The toroidal core is typically enclosed in a plastic housing that includes a central aperture 56 enabling a power cable 60 to be extended through the aperture in the core. The power cable constitutes the primary winding of the transformer and the wire wrapped around the cross-section of the core comprises the transformer's secondary winding. Load current flowing in the primary winding (primary current) induces a secondary voltage and current in the secondary winding which is quantitatively related to the current in the primary winding. The secondary winding is typically connected to a resistor network and the magnitude of the primary current is determined from the amplitude of the voltage at the output of the resistor network. To measure the power consumed by a load, a current transformer must be installed on each conductor in which the current will be measured. As illustrated in FIG. 2A and FIG. 2B, respectively, a single current transducer 54 is connected to the digital power and energy meter 20 to monitor a single phase, line-to-neutral circuit or a single-phase, line-to-line circuit. Two current transducers 54 are required for a single-phase, direct voltage connection as illustrated in FIG. 2C. A three-phase circuit (FIGS. 2D and 2E) requires a current transducer 54 for the respective conductor of each of the three phases. An exemplary power and energy meter from Veris Industries, L.L.C. can be configured to scale the output of current transformers having primary current measurement ranges from 5 amps (A) to 32,000 A.

Figure 3:
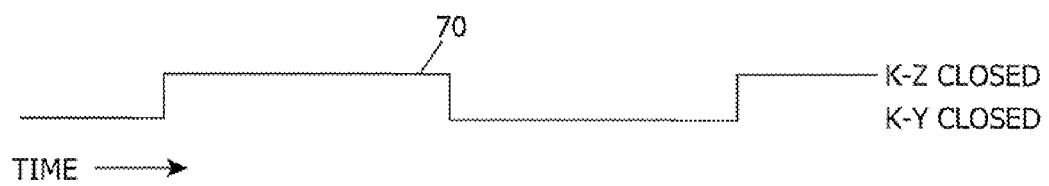
FIG. 3 is graphical representation of a KYZ pulse communication.

While a digital power and energy meter's flexibility makes it adaptable to a range of circuit types with widely varying voltage and current levels, the same flexibility can make installation and set up confusing and subject to error especially when the meter is arranged for pulse communication, a classic method of communicating with programmable logic controllers; heating, ventilation and air conditioning equipment; and other industrial control systems. Electromechanical power meters remotely reported power output with a series of electrical pulses generated by a rotating disk where the time between the pulses signified demand and the number pulses represented the total power usage. The power and energy meter 20 also includes a pulse generator 62, sometimes referred to as a KYZ interface for generating pulse communications. Referring to FIG. 3, the pulse generator of a KYZ interface acts as a single pole, double throw switch where K is the common terminal, Z is a normally open terminal and Y is a normally closed terminal. When the meter measures a unit of power represented by the pulse, the status of the output switch changes, that is, if the switch was open, it will be closed and if the switch was closed, it will be opened producing a sequence of pulses 70. The pulses produced by the pulse generator are transmitted through the meter's communication interface 34 which may transmit the pulse communications as electrical signals; optical signals, for example, by periodic illumination of a light emitting diode (LED), audible signals or any other signaling method compatible with the signal's receiver. The flexibility of the digital power meter creates a particular problem in setting up the meter's analog pulse output because both the weight of a pulse, the units of power represented by a pulse, and the time duration of the pulse must be set. However, if the pulse weight is too low and/or the pulse duration is too long, the output pulses will be inadequate to indicate the power being measured by the meter. The inventors concluded that enabling the meter to self configure would reduce the time required and improve the accuracy of the configuration process.

Figure 4:
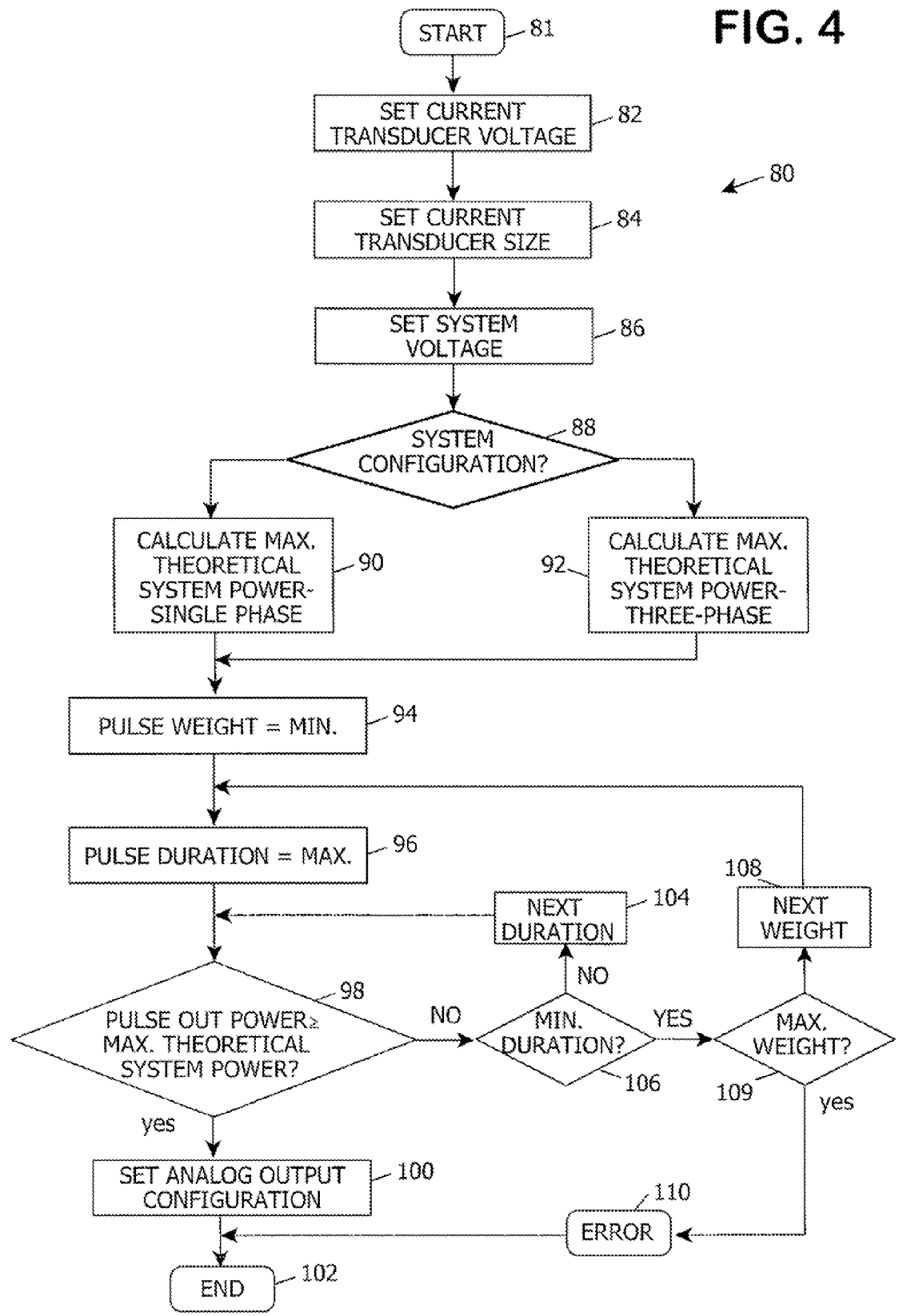
FIG. 4 is flow diagram of a first method of configuring a power and energy meter.

Referring to FIG. 4, when the configuration procedure 80 is initiated 81; the user is requested by a message on the meter's display or the display of another computing device to set the current transducer voltage 82. For example, digital power and energy meters, such as the meter 20, can commonly be used with current transformers having various full-scale output voltages, for example, current transformers having full-scale output voltages of 1.0 V or 0.33 V. Next, the user is instructed to enter the "size" of the current transducer 84, the maximum primary winding current measurable by a particular current transformer. The user then enters the system voltage 86 which is typically the nominal line-to-line voltage or in the case of a single phase line-to-neutral system configuration, the line-to-neutral voltage and a system configuration describing the type of circuit, for example, single-phase, line-to-line or three-phase, which is to be monitored by the meter 88. From the system voltage, current transducer size and system type, the meter calculates a theoretical maximum system power. For a single phase system, the theoretical maximum power 90 is:

$$\text{Maximum theoretical system power} = \text{current transformer size} \times \text{system voltage} \quad (1)$$

For a three-phase system, the theoretical maximum power 92 is:

$$\text{Maximum theoretical system power} = 3 \times \text{current transformer size} \times (\text{system voltage}/1.732) \quad (2)$$

The maximum theoretical system power is used by the meter to determine if a combination of pulse weight and pulse duration will enable the meter to output a sufficient number of pulses, each representing a specific unit of energy or power, to represent the maximum power that the meter will see during operation.

A plurality of pulse weights and pulse durations potentially transmissible by the meter are stored in the memory 36 of the meter 20. The potential pulse weights range from a minimum power per pulse, for example, ten watt-hours per pulse (Wh/p) to a maximum power per pulse, for example, 10,000 Wh/p. Likewise, the potential pulse duration ranges from a minimum duration, for example, 10 milliseconds per pulse (mS/p) to a maximum pulse duration, for example, 500 mS/p. The meter selects the minimum pulse weight 94 and the maximum pulse duration 96 transmissible by the meter and determines if the maximum power that can be represented by a pulse output of this pulse weight and duration is greater than or equal to the maximum theoretical power measureable by the meter 98, that is:

$$\text{Pulse output}(1800 \times \text{pulse weight}(Wh)/\text{pulse duration}) \geq \text{Maximum theoretical power} \quad (3)$$

If the pulse output power represented by the specific pulse weight and pulse duration is greater than or equal to the maximum theoretical power 98, the output of the meter will be sufficient to record the power measurable by the meter and the meter stores the pulse weight and pulse duration in its memory 100 for use during operation and the configuration process ends 102. However, if the combination of pulse weight and pulse duration is not adequate to denote the maximum theoretical power 98, the meter selects the next shorter pulse duration 104 and recalculates the adequacy of the combination of pulse weight and pulse duration. If the meter tests the minimum pulse duration 106 and is unable to find a pulse duration which when combined with the minimum pulse weight will enable an pulse output power greater than the maximum theoretical power 98, the meter selects the next larger pulse weight 108 and repeats the testing process with progressively shorter pulses and then, if necessary, greater pulse weights until a combination of the least pulse weight and longest pulse duration produces a pulse output power equal to or greater than the maximum theoretical power 98. If a suitable combination of pulse weight 109 and pulse duration cannot be found, the meter warns the user of the error 110.

Figure 5A:
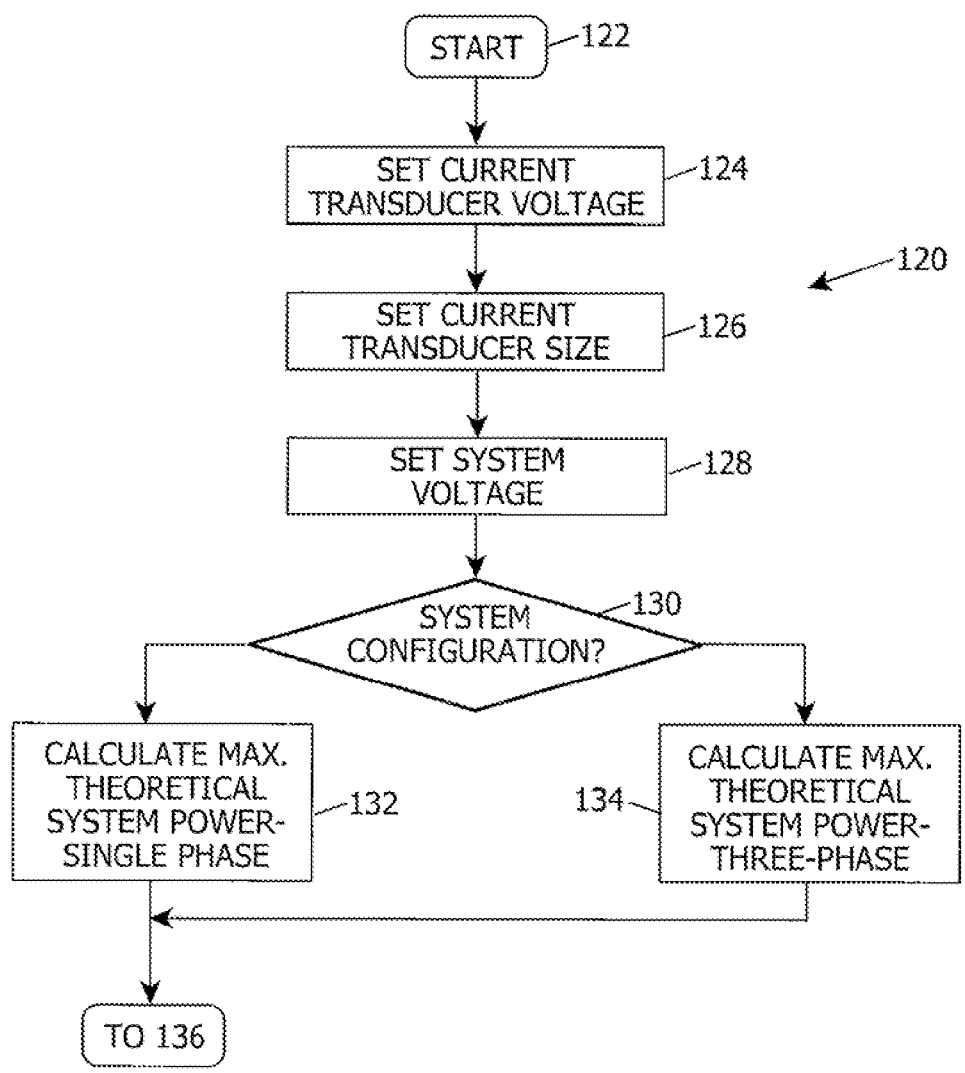
FIG. 5A is a first portion of a flow diagram of a second method of configuring a power and energy meter.
Figure 5B:
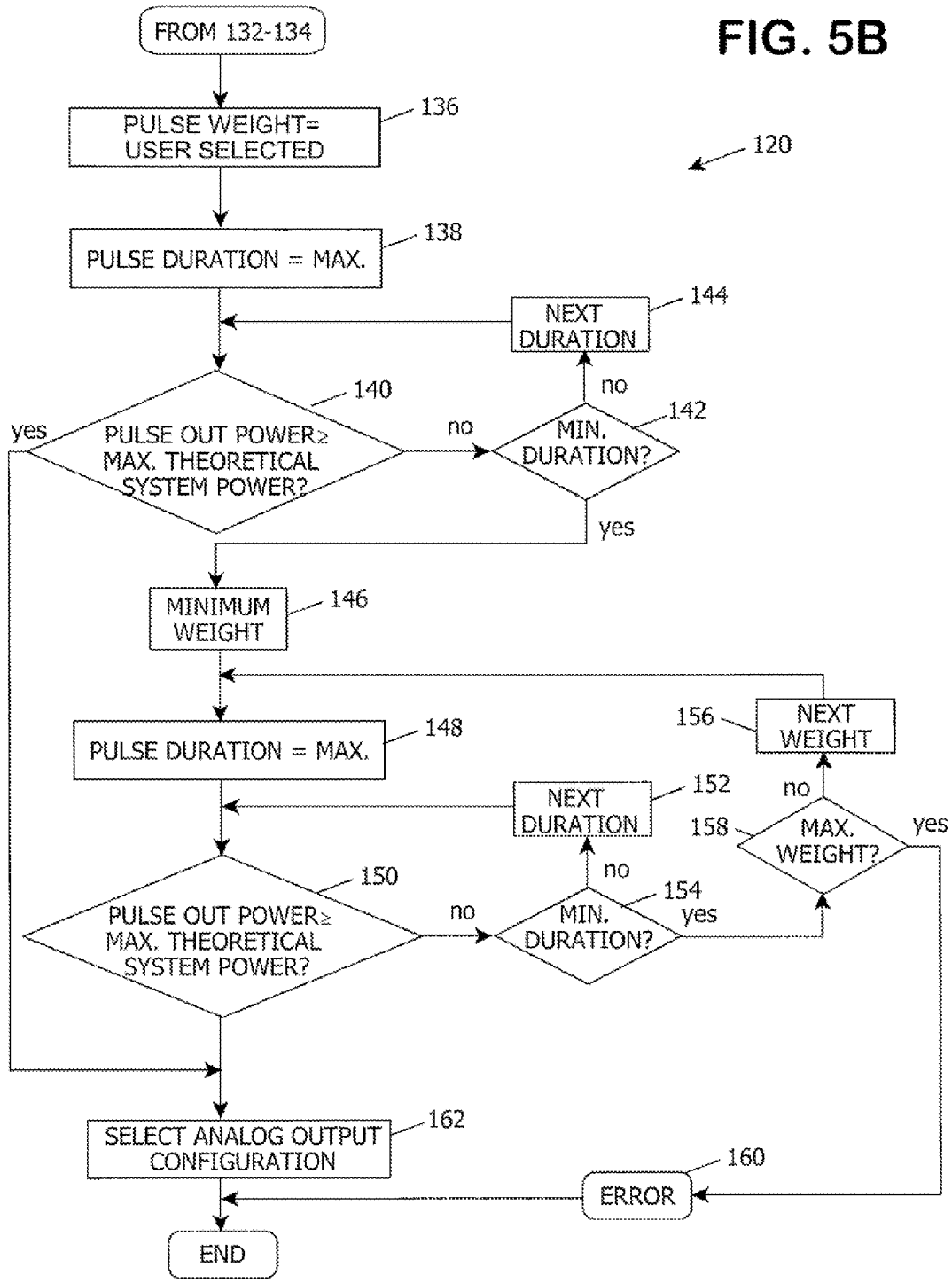
FIG. 5B is a continuation of the flow diagram of FIG. 5A.

Alternatively, referring to FIGS. 5A and 5B, the meter 20 may employ a second configuration method 120 in which the user selects an initial pulse weight. When the configuration method 120 is initiated 122, the user is prompted to input the current transducer voltage 124, the current transducer size 126, the system voltage 128 and the system configuration 130. From this input, the meter calculates the maximum theoretical system power for a single-phase 132 (or DC) or a three-phase 134 circuit. The user is then prompted to enter one of the pulse weights transmissible by the meter as an initial pulse weight 136. For example, the initial pulse weight may be the pulse weight in use with the meter before a modification of the meter's configuration which often requires reconfiguration of the meter. The meter will then select the maximum pulse duration 138 and test whether the pulse output power is greater than the maximum theoretical power 140. If not, the system determines if the minimum duration pulse was used in the test 142 and, if not, selects the next shorter pulse duration 144 and repeats the step of testing the pulse output power against the maximum theoretical power 140 with this pulse weight and duration. If the minimum pulse duration has been reached and no solution found 142, the meter selects or directs the user to select the minimum pulse weight 146. The meter then selects the maximum pulse duration 148, calculates the pulse output power and tests the result against the maximum theoretical power 150. If the pulse output power is less than the maximum theoretical power 150, the meter selects the next shorter pulse duration 152 and repeats the test 150. If no solution is found when the meter has reached the minimum pulse duration 154, the meter selects the next greater pulse weight 156 and repeats the process until a pulse power output with having the least pulse weight and longest pulse duration is found which results in an output power equaling or exceeding the maximum theoretical power 150. The user can then select a greater pulse weight 136 and the meter, starting with the maximum pulse duration 138, will attempt to find a pulse duration producing a pulse power output equal to or greater than the maximum theoretical power 140. If a second acceptable combination of pulse weight and pulse duration is found, the user can select and store in the meter's memory either acceptable combination of pulse weight and pulse duration 162 for use during operation. If an acceptable combination of pulse weight and pulse duration cannot be found at the maximum pulse weight, an error is signaled to the user 160.

Self-configuration reduces the time required and errors encountered in commissioning a new or modified digital power meter with pulse communication.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A method of configuring a power meter, said method comprising the steps of:
   (a) comparing a maximum power measurable by said power meter to a pulse output power from said power meter comprising a pulse having an initial pulse weight and an initial pulse duration by using a processing device of said power meter; and
   (b) said processing device of said power meter determining based upon said comparing changing at least one of said pulse weight and said pulse duration of said power meter until said pulse output power from said power meter is at least equal to said maximum power measurable by said power meter without changing said maximum power measurable by said power meter.

2. The method of configuring a power meter of claim 1 wherein said initial pulse weight is a maximum pulse weight of a plurality of potential pulse weights transmissible by said power meter.

3. The method of configuring a power meter of claim 1 wherein said initial pulse duration is a minimum pulse duration of a plurality of durations of a pulse transmissible by said power meter.

4. The method of configuring a power meter of claim 1 wherein said initial pulse weight is one of a plurality of user selectable potential pulse weights for a pulse transmissible by said power meter.

5. A method of configuring a power meter, said method comprising the steps of:
   (a) comparing a maximum power measurable by said power meter to a pulse output power from said power meter comprising a pulse having an initial pulse weight and an initial pulse duration;
   (b) based upon said comparing changing at least one of said pulse weight and said pulse duration of said power meter until said pulse output power from said power meter is at least equal to said maximum power measurable by said power meter without changing said maximum power measurable by said power meter;
   (c) wherein said maximum power measurable by said power meter comprises a product of a maximum primary current measurable by a current transducer of said power meter and a voltage of a circuit to be monitored by said power meter.

6. A method of configuring a power meter, said method comprising the steps of:
   (a) calculating a maximum theoretical power measurable by said power meter;
   (b) calculating a pulse output power for said power meter, said pulse output power comprising a communication pulse having a minimum pulse weight of a plurality of potential pulse weights of pulses transmissible by said power meter and a maximum pulse duration of a plurality of potential durations of pulses transmissible said power meter;
   (c) if said pulse output power is not at least equal to said maximum theoretical power, calculating said pulse output power for a next shorter duration of said plurality of potential durations of pulses transmissible by said power meter;
   (d) if said pulse output power is not at least equal to said maximum theoretical power when calculated with a minimum pulse duration of said plurality of potential pulse durations, calculating said pulse output power for a next greater pulse weight of said plurality of potential pulse weights and said maximum pulse duration;
   (e) repeating steps (c) and (d) until said pulse output power is at least equal to said maximum theoretical power; and
   (f) configuring said power meter to transmit a pulse having a least pulse weight and a longest pulse duration which results in a pulse output power at least equal to said maximum theoretical power.

7. The method of configuring a power meter of claim 6 further comprising the steps of:
   (a) inputting to said power meter a maximum primary current measurable a current transducer;
   (b) inputting to said power meter a voltage for a circuit to be monitored by said power meter; and
   (c) inputting to said power meter a system configuration for said circuit to be monitored by said power meter.

8. The method of configuring a power meter of claim 7 wherein said system configuration is one of a single-phase system or a three-phase system.

9. A method of configuring a power meter, said method comprising the steps of:
   (a) calculating a maximum theoretical power measurable by said power meter;
   (b) calculating a pulse output power for said power meter, said pulse output power comprising a communication pulse having a selected one of a plurality of potential pulse weights of pulses transmissible by said power meter and a maximum pulse duration of a plurality of potential durations of pulses transmissible said power meter;
   (c) if said pulse output power is not at least equal to said maximum theoretical power, calculating said pulse output power for a pulse having a next shorter duration of said plurality of potential pulse durations;
   (d) if said pulse output power is not at least equal to said maximum theoretical power when calculated with a minimum duration of said plurality of potential pulse durations, calculating said pulse output power for a minimum pulse weight of said plurality of potential pulse weights and said maximum pulse duration;
   (e) if said pulse output power is not at least equal to said maximum theoretical power when calculated with a minimum pulse duration of said potential pulse durations, calculating said pulse output power for a next greater pulse weight of said plurality of potential pulse weights transmissible and said maximum pulse duration;
   (f) repeating steps (d) and (e) until said pulse output power is at least equal to said maximum theoretical power; and
   (g) configuring said power meter to transmit a one of a pulse having said selected pulse weight and a longest pulse duration which results in a pulse output power at least equal to said maximum theoretical power and a pulse having a least pulse weight and a longest pulse duration which results in a pulse output power at least equal to said maximum theoretical power.

10. The method of configuring a power meter of claim 9 further comprising the steps of:
    (a) inputting to said power meter a maximum primary current measurable a current transducer;
    (b) inputting to said power meter a voltage for a circuit to be monitored by said power meter; and (c) inputting to said power meter a system configuration for said circuit to be monitored by said power meter.

11. The method of configuring a power meter of claim 10 wherein said system configuration is one of a single-phase system or a three-phase system.

12. A power meter comprising:
(a) a pulse communicator arranged to transmit a series of pulses each having a pulse duration;
(b) a memory storing a plurality of incrementally greater potential pulse weights and a plurality of incrementally longer potential durations for a pulse transmittable by said pulse communicator, a pulse weight indicative of a quantity of energy represented by a pulse; and
(c) a data processing unit arranged to quantify energy measurable by said power meter and to cause said pulse communicator to transmit a plurality of pulses indicative of said measured energy, said data processing unit arranged to select one least pulse weight of said plurality of potential pulse weights and one greatest pulse duration of said plurality of potential pulse durations such that a maximum energy measurable by said power meter does not exceed an output energy represented by a plurality of pulses of said one least pulse weight and said one greatest pulse duration.

13. The power meter of claim 12 wherein said data processing unit is arranged to:
(a) compare said maximum energy measurable by said power meter to an output energy represented by a pulse having a minimum of said potential pulse weights and a maximum of said potential pulse durations;
(b) if said maximum energy measurable by said power meter exceeds said output energy for said pulse of minimum pulse weight and maximum pulse duration, to compare said maximum energy measurable by said power meter to an output energy represented by a pulse having a minimum of said potential pulse weights and a next longer of said potential pulse durations; and
(c) if said maximum energy measurable by said power meter exceeds said output energy represented by a pulse of minimum pulse weight and a maximum of said potential pulse durations, to compare said maximum energy measurable by said power meter to an output energy represented by a pulse having a minimum of said potential pulse durations and a pulse weight greater than said minimum of said potential pulse weights.

14. The power meter of claim 12 wherein said data processing unit is arranged to determine said maximum energy measurable by said power meter from a maximum current sensible by a current transducer, a voltage sensible by a voltage transducer and a configuration of a circuit to be monitored by said power meter.

15. A power meter comprising:
(a) a pulse communicator arranged to transmit a series of pulses each having a pulse duration;
(b) a memory storing a plurality of incrementally greater potential pulse weights and a plurality of incrementally longer potential pulse durations for said pulse transmittable by said pulse communicator, a pulse weight indicative of a quantity of energy represented by a pulse; and
(c) a data processing unit arranged to quantify energy measurable by said power meter and to cause said pulse communicator to transmit a plurality of pulses indicative of said measured energy, said data processing unit arranged to select one of:
(i) a pulse having a pulse weight selected by a user and a shortest one of said potential pulse durations if a maximum energy measurable by said power meter does not exceed a first output energy represented by a plurality of pulses of said pulse weight selected by said user and said shortest one of said potential pulse durations; and
(ii) if said maximum energy measurable by said power meter exceeds said first output energy, a pulse having one least pulse weight of said plurality of potential pulse weights and one longest pulse duration of said plurality of potential pulse durations such that said maximum energy measurable by said power meter does not exceed an output energy represented by a plurality of pulses of said one least pulse weight and said one longest pulse duration.

16. The power meter of claim 15 wherein said data processing unit is arranged:
(a) to compare said maximum energy measurable by said power meter to an output energy represented by a pulse having said pulse weight selected by said user and a longest of said potential pulse durations;
(b) if said maximum energy measurable by said power meter exceeds said output energy for said pulse of said pulse weight selected by said user and said longest pulse duration, to compare said maximum energy measurable by said power meter to an output energy represented by a pulse having a pulse weight selected by said user and a next shorter of said potential pulse durations;
(c) if said maximum energy measurable by said power meter exceeds said output energy for said pulse of said pulse weight selected by said user and a shortest of said potential pulse durations, to compare said maximum energy measurable by said power meter to an output energy represented by a pulse having a minimum of said potential pulse weights and a longest of said potential pulse durations;
(d) if said maximum energy measurable by said power meter exceeds said output energy for said pulse of minimum pulse weight and longest pulse duration, to compare said maximum energy measurable by said power meter to an output energy represented by a pulse having a minimum of said potential pulse weights and a next shorter of said potential pulse durations; and
(e) if said maximum energy measurable by said power meter exceeds said output energy represented by a pulse of minimum pulse weight and a maximum of said potential pulse durations, to compare said maximum energy measurable by said power meter to an output energy represented by a pulse having a pulse weight greater than said minimum of said potential pulse weights and a longest of said potential pulse durations.

17. The power meter of claim 15 wherein said data processing unit is arranged to determine said maximum energy measurable by said power meter from a maximum current sensible by a current transducer, a voltage sensible by a voltage transducer and a configuration of a circuit to be monitored by said power meter.

* * * * *